United States Patent [19]

Schaefer et al.

[11] Patent Number: 4,712,560

[45] Date of Patent: Dec. 15, 1987

[54] APPARATUS AND METHOD OF ACQUIRING PHYSIOLOGICAL GATING SIGNALS FOR MAGNETIC RESONANCE IMAGING OF MOVING OBJECTS

[75] Inventors: Daniel J. Schaefer, Waukesha; Kenneth W. Belt, Fort Atkinson, both of Wis.

[73] Assignee: General Electric Company, Milwaukee, Wis.

[21] Appl. No.: 764,092

[22] Filed: Aug. 9, 1985

[51] Int. Cl.⁴ .............................................. A61B 5/05
[52] U.S. Cl. .................................... 128/653; 128/696; 128/721; 324/309
[58] Field of Search ....................... 128/653, 721–723, 128/695, 696; 324/309, 307, 300

[56] References Cited

U.S. PATENT DOCUMENTS

| | | | |
|---|---|---|---|
| 3,483,860 | 12/1969 | Namerow | 128/653 |
| 3,524,058 | 8/1970 | Robertson et al. | 128/723 |
| 3,993,995 | 11/1976 | Kaplan et al. | 128/653 |
| 4,279,257 | 7/1981 | Hochstein | 128/653 |
| 4,387,722 | 6/1983 | Kearns | 128/716 |
| 4,413,233 | 11/1983 | Fossel et al. | 324/300 |
| 4,474,185 | 10/1984 | Diamond | 128/722 |
| 4,545,384 | 10/1985 | Kawachi | 128/653 |

OTHER PUBLICATIONS

R. Vas et al., "The Displacement Cardiograph"; JEEE Transactions on Biomedical Engineering, vol. BME-23, No. 1, Jan. 1976.

D. L. Wilson et al., "Physical Principles of the Displacement Cardiograph Including a New Device Sensitive to Variations in Torso Resistivity"; JEEE Transactions on Biomedical Engineering, vol. BME-28, No. 10, Oct. 1981.

Primary Examiner—William E. Kamm
Assistant Examiner—Ruth S. Smith
Attorney, Agent, or Firm—Leydig, Voit & Mayer

[57] ABSTRACT

An apparatus and method are disclosed which provide signals corresponding to physiological motion of an imaging slice in an MR system for use in synchronizing acquisition of MR data with movement of the slice. The signals are generated by initiating an incident signal of a frequency $\omega$ which interacts with the imaging slice and returns a reflected signal of a frequency $\omega$. By mixing the incident and reflected signal, a baseband signal is generated which is indicative of changes in the phase and magnitude relationships between the signals. Because changes in the phase and magnitude relationships between the signals are related in an approximately linear manner to movement of the imaging slice, the baseband signal provides an indication of movement of the imaging slice of sufficient quality to serve as an accurate triggering signal to synchronize acquistion of MR data with movement of the imaging slice.

23 Claims, 10 Drawing Figures

APPARATUS AND METHOD OF ACQUIRING PHYSIOLOGICAL GATING SIGNALS FOR MAGNETIC RESONANCE IMAGING OF MOVING OBJECTS

TECHNICAL FIELD

This invention relates to magnetic resonance imaging (MRI) apparatus and, more particularly relates to non-contact techniques for acquiring respiration and cardiac gating waveforms for use in connection with MR imaging.

BACKGROUND

In the past, the MRI phenomenon has been utilized by structural chemists to study, in vitro, the molecular structure of organic molecules. Typically, MRI spectrometers utilized for this purpose were designed to accommodate relatively small samples of the substance to be studied. More recently, however, MRI has been developed into an imaging modality utilized to obtain images of anatomical features of live human subjects. Such images depicting parameters associated with nuclear spins (typically hydrogen protons associated with water in tissue) may be of medical diagnostic value in determining the state of health of tissue in the region examined. The use of MRI to produce images and spectroscopic studies of the human body has necessitated the use of specifically designed system components, such as the magnet, gradient and RF coils.

In imaging techniques using the MRI phenomenon, it is necessary that the subject to be imaged remains motionless. Because known imaging techniques span time periods of typical heart and respiratory cycles, some movement of the subject is inevitable. A known method of avoiding distortion of an MR image from biological motion such as heart and lung movement, is to gate the acquisition of MRI signals to the cyclic movement of the heart or lungs. Unfortunately, in order to gate the acquisition of MRI signals to body movement such as heart or lung motion, it has been necessary to place probes on or in close proximity to the subject. This requirement results in probes being placed inside the bore of the main magnet—an undesirable situation since the probes may often generate distortions in the uniform magnetic field $B_0$ and/or in the radio frequency field, $B_1$, with a resulting reduction in image quality. The necessity of applying probes to the patient also reduces scanner throughput thereby increasing the cost per scan.

SUMMARY OF THE INVENTION

It is the general object of the invention to provide an apparatus and method for acquiring physiological gating signals for the MR imaging of body sections of a subject which are characterized by periodic motions without disrupting the main magnetic field.

It is a more detailed object of the invention to provide an apparatus and method for acquiring physiological gating signals without physically contacting the body and without introducing sensors into the bore of the main MRI magnet.

It is another object of the invention to provide an apparatus and method for acquiring physiological signals which are sufficiently sensitive so as to be indicative of both external and internal physiological motion.

These and other objects and advantages of the invention will become more apparent from the following detailed description when taken in conjunction with the accompanying drawings.

In accordance with the invention, signals corresponding to physiological motion of a subject are provided by mixing generated signals with their reflections to produce a baseband signal. This baseband signal is indicative of the phase and amplitude relationships between the generated and reflected signals wherein these phase and amplitude relationships are modulated by the relative motion between the transducer and the subject being monitored. Physiological motion may be sensed by means of a resonant radio frequency (RF) coil which may be the same RF coil used to nutate nuclei during magnetic resonance imaging (MRI). Body motion modulates the quality factor (Q) of the coil and the load impedance (Z) the coil presents to the RF source. As a result of this modulation of coil characteristics by body motion, the reflection coefficient between the RF source and coil is also modulated. Consequently, when the reflected signal is mixed (heterodyned) with the forward signal, a baseband signal results which contains information indicative of motion from internal and external regions of the body (e.g., chest wall, heart, gastrointestinal tract, etc.).

Quadrature techniques may be used to resolve the magnitude and phase of the reflection coefficient. Both these quantities contain physiological motion information. If phase information is to be used, either the reflection coefficient must be sampled at a plane where the phase is finite or the coil must be interrogated at a frequency slightly off resonance. For small motions, the phase changes in the reflection coefficient are linearly related to body motion. Small changes in the magnitude of the reflection coefficient are also linearly related to body motion. Either or both of these quantities may be used to obtain the gating signal for MRI. Changes in the resonant frequency of the coil at the MRI (Larmor) frequency or at other resonant frequencies are also linearly related to body motion and could be used to obtain the gating signal. The sensitivity of the invention to the phase and magnitude of the reflected signals is sufficient to detect the small displacement of the body surface caused by a heart beat.

BRIEF DESCRIPTION OF THE DRAWINGS

The features of the invention believed to be novel are set forth with particularity in the appended claims. The invention itself, however, both as to its organization and method of operation, together with further objects and advantages thereof, may best be understood by reference to the following description taken in conjunction with the accompanying drawings in which:

DETAILED DESCRIPTION OF THE PREFERRED EMBODIMENT

Figure 1:
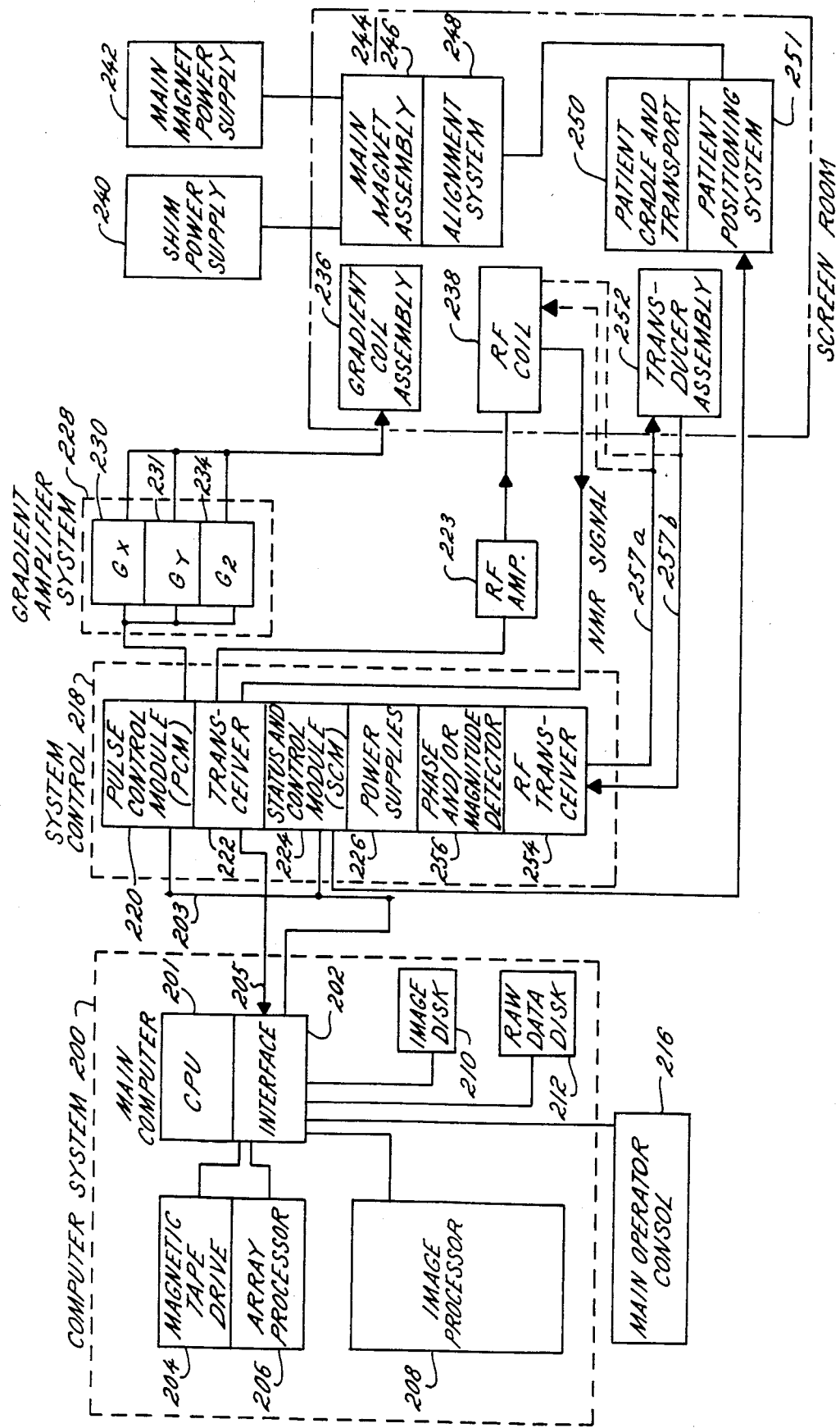
FIG. 1 is a schematic block diagram of the major component elements of an MRI system according to the invention.

Referring to FIG. 1, overall system operation for MR imaging is under the control of a computer system generally designated 200 which includes a main computer 201, such as a Data General MV4000. The computer 201 has associated therewith an interface 202 through which a plurality of peripheral devices and other MRI system components are coupled. Among the peripheral devices which may be utilized under the direction of the main computer 201 is a magnetic tape drive 204 for archiving patient data and images to magnetic tape. Processed patient data may also be stored in an image disk storage device 210. An array processor 206 is utilized for pre-processing data and data reconstruction.

In order to provide interactive image display manipulation such as magnification, image comparison, and gray scale adjustment, an image processor 208 is joined to the main computer 201 via interface 202. The computer system 200 is provided with a means to store raw (unreconstructed) image data utilizing a disk storage system 212. An operator console 216 is also coupled to the computer 201 via the interface 202 and provides the operator with the means to input data pertinent to a patient study as well as additional data necessary for proper MRI system operation, such as initiating and terminating scans. The operator console may also include a CRT for displaying images stored on disks or magnetic tape.

Control over the MRI system is exercised by means of control and gradient amplifier systems 218 and 228, respectively. The computer 201 communicates with the system control 218 by way of a conventional digital communication network 203 (such as an Ethernet network) in a manner well known to those skilled in the art. The system control 218 includes several subsystems such as the pulse control module 220 (commonly referred to PCM), a radio-frequency transceiver 222, a status and control module 224 (commonly referred to as SCM), and the power supplies 226 necessary to energize the components of the system control 218. In response to control signals from the main computer 201, the PCM generates digital timing and control signals such as the current waveforms used for gradient coil excitation, as well as RF envelope waveforms utilized in the transceiver 222 for modulating RF pulses.

The current waveforms from the PCM 220 are applied to the gradient amplifier system 228 generally comprising $G_x$, $G_y$, and $G_z$ amplifiers 230, 232 and 234, respectively. Each amplifier is utilized to excite a corresponding gradient coil in a gradient coil assembly 236. When energized, the gradient coils of the gradient coil assembly 236 generate substantially linear, mutually orthogonal magnetic field gradients $G_x$, $G_y$ and $G_z$ directed in the x, y and z-axis direction, respectively, of a cartesian coordinate system. In a manner well known to those skilled in the art, the gradient magnetic fields $G_x$, $G_y$ and $G_z$ generated by the gradient coil assembly 236 are utilized in combination with radio-frequency pulses generated by transceiver 222 to encode spatial information into the MRI signals emanating from the region of the patient under study.

Waveforms and control signals provided by the PCM 220 are utilized by transceiver 222 for RF carrier modulation and control of the operating mode; that is, the transmit or receive mode. In the transmit mode, the transmitter 222 provides a radio-frequency carrier waveform modulated in accordance with the control signals from the PCM 220 to an RF power amplifier 223 which then energizes a RF coil 238 which is physically located inside the main magnet assembly 246. In a receive mode, the RF coil 238 senses the MRI signals radiated by the excited nuclei (a separate RF coil may be used for the receive mode if desired). The signals are detected, filtered, and digitized in the transceiver 222. The digitized signals are delivered to the main computer 201 for processing by means of a dedicated, unidirectional, high-speed digital link 205 which links interface 202 and transceiver 222.

The PCM 220 and SCM 224 are independent subsystems both of which communicate with the main computer 201, peripheral systems such as the patient positioning system 251, as well as to one another by way of the digital communication network 203. The PCM 220 and SCM 224 are each comprised of a sixteen-bit computer (such as an Intel 8086) for processing commands from the main computer 201. The SCM includes means for acquiring information regarding patient cradle (not shown) position and position of the movable patient alignment light fan beam (not shown). This information is used by main computer 201 to modify image display and reconstruction parameters (such as offset). The SCM 224 also initiates functions such as actuation of the patient alignment and transport systems 248 and 250, respectively.

The gradient coil assembly 236 and the RF coil 238 are mounted within the bore of the magnet in the main magnet assembly 246 utilized to produce the polarizing magnetic field $B_0$. The magnet in the main magnet assembly 246 also surrounds the patient alignment system 248, a shim coil power supply 240 and a main magnet power supply 242. The shim power supply 240 is utilized to energize shim coils (not shown) associated with the main magnet assembly 246 and which are used to correct inhomogeneities in the polarizing magnetic field $B_0$. The patient alignment system 248 operates in combination with a patient cradle and transport system 250 and patient positioning system 252 in a well-known manner.

To minimize interference from external sources, the MRI system components including the main magnet assembly 246, the gradient coil assembly 236, and the RF coil 238, as well as the associated power supplies and patient handling devices, are enclosed in an RF-shielded room 244. The shielding is generally provided by a copper or aluminum screen network which enclosed the entire room. The screen network serves to contain the RF signals generated by the system, while shielding the system from RF signals generated outside the room. For isolating the RF signals, a bi-directional attenuation of approximately 80 db in the frequency range of operation, 10 MHz–80 MHz, is appropriate.

In accordance with the invention, a signal is generated within the bore of the MRI magnet causing an interaction of the signal with the body of the subject in the area of the body to be imaged such that a reflection of the generated signal is characterized by changes in magnitude and phase, wherein such changes are indicative of body motion and provide a basis for timing the acquisition of MRI signals. By mixing the generated and reflected signals, a single signal can be generated which is encoded with changes in the relative phase and amplitude of the two signals caused by body motion. A low pass filtering of the combined signal leaves only the slow changing phase and magnitude relationships, which are directly related to movement of the body. Specifically, the amplitude of the signal indicates the relative extent of movement, a positive or negative slope of the signal indicates the relative direction of movement and the angle of the slope indicates the speed of the movement. Further frequency filtering may separate signals indicative of heart and lung movement (or other motion) in order to provide the desired type of physiological signal for triggering acquisition of MRI data or for their own diagnostic information. Such systems are not adversely affected by moderate thicknesses of non-metallic, relatively dry clothing.

In keeping with the invention, the MRI system of FIG. 1 includes a transmit and receive transducer assembly 252 within the RF-shielded room 244 for providing the aforementioned electronic signal indicative of physiological movement of the patient for use in triggering or gating the pulse sequence. The signal from the transducer assembly 252 supplies to the SCM 224, via the RF transmitter 254, and phase detection 256, an indication of body motion from which trigger pulses are generated for synchronizing the patient's physiological movement with the scanning time associated with the MRI pulse sequence. Preferably, the RF transmitter 254 and phase detector 256 provide respiratory or cardiac signals or other gating signals to the SCM 224. The SCM 224 uses these signals to initiate the pulse sequence at the PCM 220 during times of minimum body movement. While diagnostic quality signals are not required from the RF transmitter 254 and phase detector 256, the signal must enable the SCM 224 to recognize time of no or little physiological motion and/or to recognize a particular position in the physiological motion cycle for imaging during various points in the cycle.

As with other electrical signals passing through the screen room, the electrical signal to and from the transducer assembly 252 must pass through an 80 db filter (not shown) for frequencies between 10 MHz–80 MHz. Because the signals indicative of cyclic body motion are obviously at very low frequencies, there should be negligible insertion loss for signal frequencies below 100 hertz. The cable links 257a and 257b to and from the transducer assembly 252 and the system control 218 should be limited in length to 150 feet.

Figure 2:
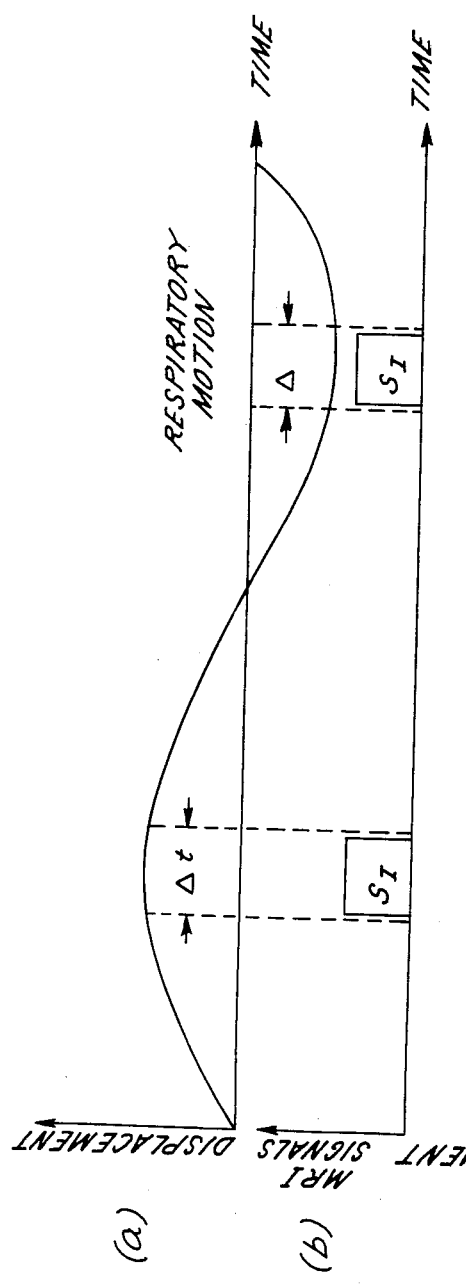
FIGS. 2a–d are simplified and non-rigorous waveform diagrams illustrating how waveforms indicative of physiological motion of the body derived from the invention (FIGS. 2a and 2c) can be used to synchronize acquisition of MRI signals (FIGS. 2b and 2d) with periodic movement of the body.

Referring to FIG. 2, the SCM 224 of FIG. 1 may control the initiation of an MRI signal sequence and data acquisition $S_I$ at times $\Delta t$ of slow or other periodic positions of chest movement (FIGS. 2a and 2b) or times $\Delta t'$ of slow or other periodic positions of cardiac movement (FIGS. 2c and 2d), depending upon which movement best characterizes the desired position of the imaging slice. Although the waveforms of FIGS. 2a–d are not intended to be a rigorous depiction of respiratory or cardiac motions, they serve to illustrate that a signal indicative of body motion may serve as a means for isolating portions of cyclic physiological movements in order to gather MRI signals for a signal image over a plurality of cycles such that the final image is not blurred by the motion.

Referring particularly to FIGS. 2(a) and (b), initiation of an MR sequence and data acquistion $S_I$ is depicted as occurring at the maximum and minimum of respiratory motion since movement of the tissue is slowest during these times. But, preferably, the MR sequence and data acquisition $S_I$ is triggered only on the maximum or the minimum positions since the positions represent two relatively different positions of the imaging slice in its respiratory cycle. It will be appreciated that the imaging signals $S_I$ can be synchronized with any portion of the respiratory cycle in order to provide an image of the slice at a point in the respiratory cycle of paticular interest.

Similarly, FIGS. 2(c) and (d) indicate initiation of the imaging signal $S_I$ during periods of minimum cardiac motion, but the imaging signal may be triggered to provide an image of the heart at any part of its cardiac cycle. Regarding this synchronization of acquisition of imaging data with periodic physiological motion, an analogy may be made with the "freezing" of periodic motion using strobe lights.

Figure 3:
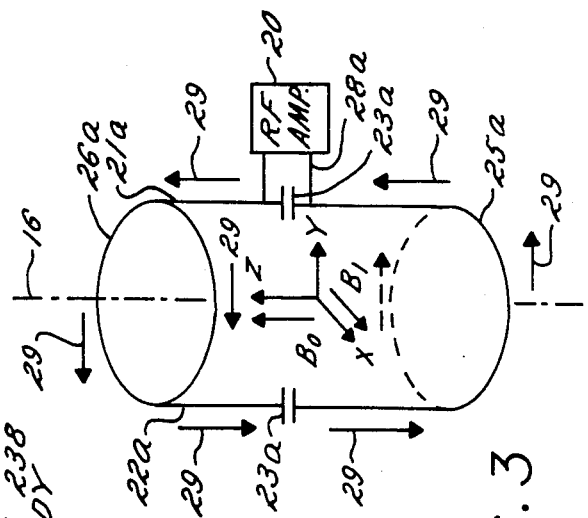
FIG. 3 is a schematic depiction of the RF coil in the MRI system shown in FIG. 1.

In practicing the invention, the RF coil 238 of FIG. 1 preferably provides the function of the transducer assembly 252 in addition to its task of providing the RF signals for MR imaging, thereby eliminating the requirement of adding a new element to the system and its introduction into the sensitive environment of the imaging system. For example, the single-turn saddle coil illustrated in FIG. 3 is a particular RF coil used in MR imaging comprised of two parallel conductive segments 21a and 22a each having a capacitor 23a connected in series therewith. The ends of conductors 21a and 22a are connected to diametrically opposed points on a pair of parallel conductive loops 25a and 26a spaced apart along common longitudinal axis 16.

For MR imaging, the RF coil 238 is driven by the transceiver 222 which is illustrated as an RF amplifier 20 in FIG. 3 connected between terminals 27a and 28a in parallel with the capacitor in segment 21a. Arrows 29 indicate the relevant current paths which produce a $B_1$ radio-frequency field perpendicular to the plane defined by conductive wire segments 21a and 22a which, for convenience, will be hereinafter referred to as being vertical. Although various coupling methods may prove to be the most appropriate for a particular imaging system, the most probable coupling of the signal for acquiring physiological data to the RF coil is a conventional RF coupling. To implement the coupling, the RF signal for physiological data may simply be RF coupled in a conventional manner to the output of the RF amplifier 20. In some particular implementations of the invention—particularly those using resonances of the RF coil higher than the primary resonance used for imaging—coupling may best be provided by a small exciting coil (not shown) mounted adjacent the RF coil 238.

Figure 4:
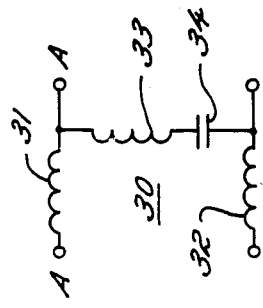
FIG. 4 is a lumped-element equivalent circuit of the RF coil illustrated in FIG. 3.

A better understanding of the RF coil depicted schematically in FIG. 3 can be acquired by study of the lumped-element-equivalent circuit for this coil configuration as shown in FIG. 4. The equivalent circuit is a balanced-ladder network generally designated 30. The network is comprised of inductive elements 31 and 32, having connected at one of its ends a series-connected combination of inductive and capacitive elements 33 and 34, respectively. The two points labeled A are joined together to complete the upper conductive loop 26a, and the points labeled B are joined to complete the lower conductive loop 25a. Inductors 31 and 32 represent the inductance associated with each loop 26a and 25a, respectively. Likewise, inductor 33 is associated with vertical wire segments 21a and 22a. At a frequency $F_{R1}$ where the cumulative phase shift for the network 30 adds to $2\pi$ radians, the coil has a standing wave resonance. This resonance is commonly referred to as the primary resonance.

Figure 5:
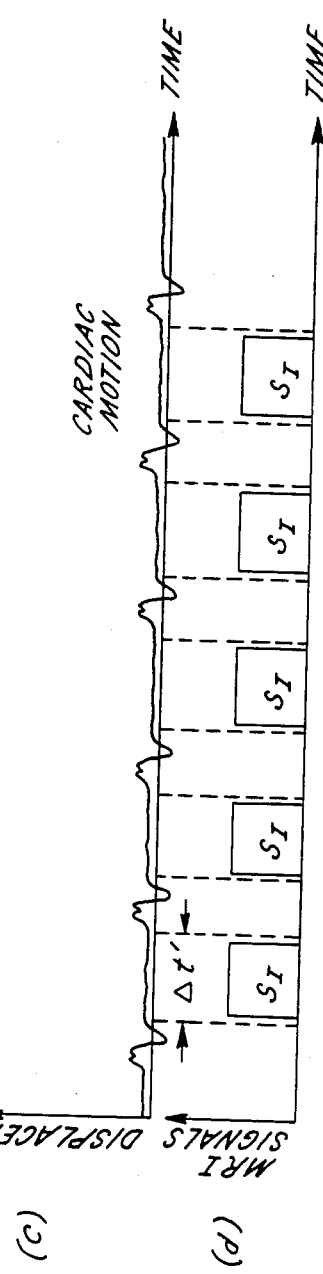
FIG. 5 is a graph of the frequency response of the RF coil, depicting the coil's primary and secondary resonances.

The coil configuration represented by the lumped-element equivalent circuit of FIG. 4 can also exhibit higher frequency resonances which produce higher order transverse field distributions. The higher resonances having center frequencies $F_{R2}$ to $F_{RN}$ in FIG. 5, are excited by using an appropriately higher frequency excitation source. These resonances will be referred to as secondary resonances. For example, when the cumulative phase shift around the network equals $4\pi$ radians, a second resonance occurs.

Figure 6:
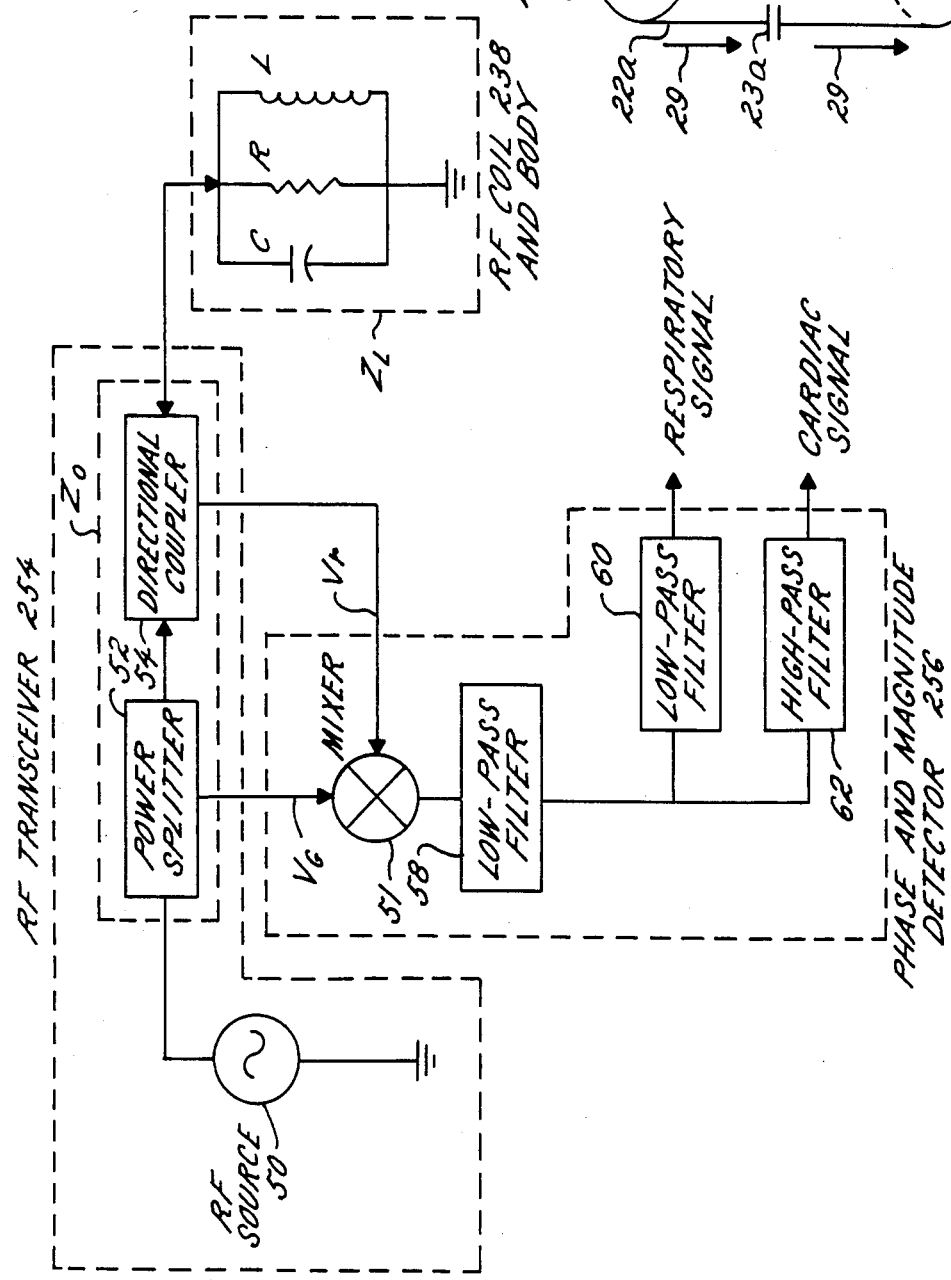
FIG. 6 is a schematic diagram of the preferred embodiment of the invention wherein the RF coil of the MRI system serves as a transducer in accordance with the invention for generating signals indicative of physiological movement of a patient positioned inside the MRI device.

When a patient is introduced into the imaging device, the patient's body is positioned within the cylinder defined by the RF coil. At frequencies close to the primary resonance of the coil, the predominating effect of the body on the RF coil is one of impedance which loads the coil. By modeling the body as an impedance R and the RF coil 238 as an effective inductance L and capacitance C as shown in FIG. 6, the interaction between the RF coil and the body can be quantitatively analyzed. The foregoing assumes the effective impedance of the coil to be negligible relative to the effective impedance of the body.

By modeling the RF transceiver 254 of FIG. 1 and its associated electronics (a power splitter 52 and directional coupler 54) which aid in generating and receiving an RF signal as a signal generator 50 with an output impedance $Z_O$, the body and coil may be characterized as having a complex impedance $Z_L$ which is not necessarily equal to $Z_O$. Since the predominate effect of the body is to load the coil according to the body geometry and the body's fill factor (i.e., the volume and density of the body), the complex impedance of the RF coil changes as the body wall moves (due to heartbeat, respiration, and other body motions).

In the model of FIG. 6, the phase detector 256 of FIG. 1 is implemented by a double-balanced mixer 50 operating in the square law region. In a conventional manner, the power splitter 52 redirects a portion of the RF signal $V_G$ generated by the RF source 56 to the mixer 56. Also in a conventional manner, the directional coupler 54 directs the received signal $V_r$, reflected by the impedance mismatch, to the mixer 56. The signal generated by the mixer 56 includes the baseband signal which carries the physiological motion indications. By passing the signal through a low-pass filter 58, the RF frequency is removed from the signal, leaving only the more slowly changing baseband signal whose slope and magnitude can be directly related to physiological movement.

In order to isolate the different types of physiological movement which comprise the baseband signal, further high and low-pass filtering may be provided by filters 60 and 62. For example, because the human respiration cycle is typically much longer than the cardiac cycle, the low-pass filter 60 can be used to isolate a respiratory signal from the baseband signal outputed by the filter 58. Correspondingly, a cardiac signal can be isolated by the high-pass filter 62.

For a detection technique exemplified by FIG. 6, the baseband signal includes both phase and magnitude changes of the reflected signal. Both the magnitude and the phase of the reflected signal change as a function of changing impedance $Z_L$ (caused by body movement). If it is desirable to use only phase or magnitude information from the baseband signal to trigger the MRI data acquisition sequence, known quadrature techniques may be used to resolve magnitude and phase from the reflected signal.

Figure 7:
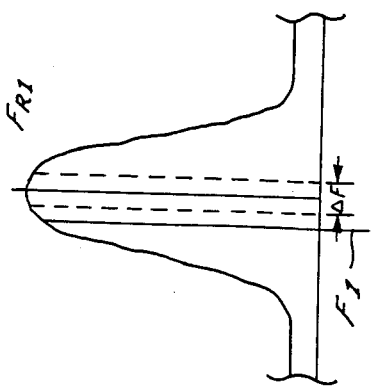
FIG. 7 is an enlarged view of the frequency response of the RF coil at its primary resonance in FIG. 5, showing the frequency $F_1$ at which the RF coil is excited in order to provide signals indicative of physiological motion in accordance with the invention.

It is possible to interrogate the body with a frequency $F_1$, near the primary resonant frequency $F_{R1}$ of the RF coil, but beyond the bandwidth $\Delta F$ of the imaging system as indicated by FIG. 7. At the frequency $F_1$, the coil is still characterized by a high Q value (i.e., quality factor), but the frequency should not interfere with the coil's functioning at the RF frequency for imaging. It is also possible to interrogate at some of the secondary resonances of the RF coil provided that the field structure is such that body movement significantly modulates the coil impedance. Preferably, the RF coil is not excited at the central frequencies since little if any phase information is available at these frequencies. Although FIG. 5 indicates the secondary resonances of the RF coil are all at higher frequencies than the imaging resonances, lower secondary resonances may also be used to excite the coil if they are available.

As evidenced by the following analysis, the phase and magnitude changes of the reflected signal are linearly related to movement of the body within the bore of the MR magnet. It is well known that an impedance discontinuity of the type illustrated in FIG. 6 will cause a reflection of a propagating wave. It is also well known that the amplitude of the reflected wave can be generally characterized as:

$$V_r = \rho V_i \quad (1)$$

where $V_r$ is the reflected voltage, $\rho$ is the reflection coefficient and $V_i$ is the incident voltage. For the system of FIG. 6, the reflection coefficient $\rho$ equals $$\frac{Z_0 - Z_L}{Z_0 + Z_L}. \quad (2)$$

For the reflected signal $V_r$, the coefficient $\rho$ includes both phase and amplitude (or magnitude) characteristics. The amplitude of the reflection coefficient $\rho$ can be expressed as follows:

$$|\rho|^2 = \frac{1 - 2z\cos\theta + Z^2}{1 + 2z\cos\theta + Z^2} \quad (3)$$

where $$z = \frac{Z_L}{Z_0}.$$

Associated with the amplitude of the reflected signal indicated by the reflection coefficient $\rho$ is an angle $\phi$ which represents a phase difference between the incident and reflected voltage. For the RF coil, the angle $\phi$ may be expressed as follows:

$$\phi = \tan^{-1}\left(\frac{2Z_R \sin\theta}{Z_R^2 - 1}\right) \quad (4)$$

where $Z_R$ is the real part of the complex impedance $Z_L$ of the RF coil and the body. The angle $\theta$ is the phase angle between the real and imaginary components of the complex impedance.

The electrical resistance of the body of the subject may be considered the entire real part of the complex impedance $Z_L$ and may be approximated as having the following value:

$$Z_R = \frac{9l}{16 \sigma \pi r^2} \quad (5)$$

where l is the length of the cylinder, $\sigma$ is the current density through the body and r is the body's radius—assuming for ease of calculation the body has a cylindrical cross-section and is homogeneous.

More generally, the admittance of the body and RF coil can be characterized as, $$Y = \frac{1}{Z_L} = \frac{1}{Z_R} + j\left(\omega C - \frac{1}{\omega L}\right) \quad (6)$$

where $\omega$ is the frequency at which the RF coil is excited.

The phase angle between the real and imaginary components of the admittance, $\theta$, is known to be, $$\theta = \tan^{-1} Z_R\left(\omega C - \frac{1}{\omega L}\right) \quad (7)$$

Combining equation (5) with equation (7), $$\theta = \tan^{-1}\left(\frac{k}{r^2}\right) \quad (8)$$

where k is a constant equal to $$\frac{9l\left(\omega C - \frac{1}{\omega L}\right)}{16\pi\sigma}.$$

As indicated by equation (8), the angle $\theta$ is directly related to the body's motion since changes in the body's radius r occur when the subject breathes, the heart contracts or other like biological motions occur.

Since $\theta$ is small near resonance, then $\sin\theta \approx k/r^2$, and substituting the value for $\theta$ given in equation (8) into equation (4) gives the following relationship:

$$\phi \approx \frac{2Z_R k}{r^2(Z_R^2 - 1)} \quad (9)$$

From equations (5)–(8), $Z_R$ may be expressed as $kn/r^2$, where $$n = 1/\left(\omega C - \frac{1}{\omega L}\right),$$

so that equation (9) becomes:

$$\phi \approx \frac{2k^2 n}{r^4\left[\frac{k^2 n^2}{r^4} - 1\right]} = \frac{2k^2 n}{k^2 n^2 - r^4} \quad (10)$$

The sensitivity of the phase, $\phi$, to the change of body radius is:

$$\frac{\partial \phi}{\partial r} = \frac{-(2k^2 n)(-4r^3)}{(k^2 n^2 - r^4)^2} = \frac{8nk^2 r^3}{(k^2 n^2 - r^4)^2} \quad (11)$$

Thus:

$$\Delta\phi = \frac{8nk^2 r^3}{(k^2 n^2 - r^4)^2}\Delta r \quad (12)$$

Since changes in the radius r of the body are approximately linearly related to changes in the phase relationship $\phi$ between the incident signal $V_i$ and the reflected signal $V_r$, then the phase information contained in the signal from the low-pass filter 58 in FIG. 6 is an accurate measure of the body's physiological motion.

Turning to the information contained in the relative magnitude of the reflected signal $V_R$, since $\theta$ is small near resonance, equation (3) may be simplified as follows:

$$|\rho| \approx \frac{1-z}{1+z} \approx \frac{1 - \frac{nk}{Z_0 r^2}}{1 + \frac{nk}{Z_0 r^2}} = \frac{Z_0 r^2 - nk}{Z_0 r^2 + nk} \quad (13)$$

The sensitivity of the magnitude of the reflection coefficient $\rho$ to changes in body radius r may be determined by taking the derivative of the magnitude of the reflection coefficient $\rho$, as expressed in equation (13), with respect to the radius r of the body:

$$\frac{\partial |\rho|}{\partial r} = \frac{2Z_0 r}{Z_0 r^2 + nk} - \frac{[Z_0 r^2 - nk][2Z_0 r]}{[Z_0 r^2 + nk^2]} \quad (14)$$

Thus:

$$\Delta\rho = \frac{Z4Z_0 nkr}{[Z_0 r^2 + nk]^2}\Delta r \quad (15)$$

From equations (12) and (15) it is clear that both magnitude and phase of the reflection coefficient $\rho$ vary linearly with small changes in body radius. In addition, from equation (12) it is clear that the sensitivity to body movement of the phase angle $\phi$ increases as n approaches a value of $r^2/k$, where $n = r^2/k$ occurs at the center frequency of a resonant response (e.g., $F_{RN}$). Correspondingly, sensitivity to body movement of the magnitude of the reflected signal increases as n approaches $$\frac{-Z_0 r^2}{k},$$

which means that the impedance phase angle should be positive. Either or both phase and magnitude of the reflection coefficient $\rho$ may be used to obtain gating waveforms of physiological motion.

In keeping with the invention, the angle $\rho$ and/or magnitude $|\rho|$ can be measured by exciting the RF coil at a frequency $F_1$ within the primary high Q region of the coil but outside the bandwidth of the MR imaging as indicated in FIG. 7 or, alternatively, at a frequency $F_{R2}$ through $F_{Rn}$ (FIG. 5) which is near a different harmonic resonance of the coil. For example, if the RF coil is tuned for primary resonance at 63.87 MHz and the imaging process utilizes a bandwidth $\Delta F$ of 32 KHz centered about 63.87 MHz, a frequency $F_1$ outside the bandwidth, but still within the high Q area of the coil's response (approximately 2 MHz in bandwidth), may be used to excite the coil and provide a reflected signal whose phase angle $\phi$ and magnitude $|\rho|$ can be measured. If practical considerations prevent the use of this frequency region (i.e., if the excitation affects image quality), the frequency may be shifted to a different harmonic resonant frequency such as 630 MHz.

The power delivered to the RF coil can be at less than one watt and still provide good quality data from the reflected signal. By the ability to perform satisfactorily at low power, the invention is less likely to disrupt the imaging process and therefore may operate in a continuous mode.

If system requirements make it undesirable for the RF coil 238 to provide the functions of the transducer assembly 252 (e.g., the extra RF signal effects image quality), a separate directional radiator, such as a horn antenna, may serve as the source of RF radiation for detecting body motion. In practicing the invention using a horn antenna, the same antenna may receive the reflected signals in a conventional manner by simply providing the antenna with a circulator. If the presence of a ferrite device such as a circulator proves to be undesirable, separate transmit and receive antennas may be used to perform the necessary functions of transmitting and receiving. Obviously if a directional radiator is employed, the available frequencies are no longer limited to the primary and secondary resonances of the RF coil 238.

Preferably, the horn antenna is located outside the radius of the RF coil and within the radius of the gradient coil. Any conventional mounting apparatus may be used for the antenna such that the horn of the antenna is fixed to the frame of the housing for the MR magnet. The antenna must be directed toward the imaging area and the beamwidth should be sufficiently wide to cover the area but not so wide as to make the reflected signal susceptible to noise generated from near-by devices.

The propagating signal, $V_p$, from the antenna may be expressed as:

$$V_p = A \cos \omega t \tag{16}$$

where "$\omega$" is the frequency of the signal expressed in radians, "A" is the peak amplitude of the signal, and "t" is the time. The reflected signal, $V_R$, received by the antenna may be expressed as:

$$V_R = B \cos \omega(t+\tau) \tag{17}$$

where $\tau$ is a time delay representative of the phase shift of the reflected signal.

It can be easily visualized that the distance, R, from the radiator to the body of the subject can be described in terms of the wavelength $\lambda$ of the propagating wave:

$$R = n\lambda + \delta\lambda \tag{18}$$

where n in an integer and $\delta$ is a number less than one.

The velocity of an electromagnetic wave propagating through air can be approximated to be the speed of light, c. For a reflected wave to return to its source, the horn antenna, it first propagates a distance R to the body, reflects off the body and travels a distance R back to the antenna. Therefore, the total time delay, $\tau$, for a reflected wave can be expressed in terms of the distance traveled by the wave and its speeds as follows:

$$\tau = 2R/C \tag{19}$$

Because the speed of the propagating signal can be considered constant, any changes in $\tau$ directly reflect changes in the distance R. Therefore, as the body moves within the bore of the MR magnet, the value of $\tau$ should also change in a linear relationship with changes in the distance of the body from the RF coil.

In order to isolate the value $\tau$ so that body movement can be detected and monitored, the reflected signal $V_R$ is first mixed with the propagating signal $V_p$ in a double-balanced mixer operating in the square law region. The resulting output $V_{IF}$ may be expressed as:

$$V_{IF} = AB\{\cos[\omega(2t+\tau)] + \cos \omega\tau\} \tag{20}$$

After low-pass filtering the signal $V_{IF}$, the resulting signal $V_O$ may be expressed as:

$$V_O = AB \cos \omega\tau \tag{21}$$

The frequency of the reflected signal, $\omega$, can be rewritten in terms of the wavelength $\lambda$, and so also can $\tau$, as indicated by equation (19), so that the argument in equation (21) becomes:

$$\omega\tau = (4\pi R)/\lambda = (4\pi/\lambda)(n\lambda + \delta\lambda) = 4\pi(n+\delta) \tag{22}$$

Thus, equation (21) becomes:

$$V_O = AB \cos 4\pi\delta \tag{23}$$

If the position of the body is such that the cosine function is maximum, then small displacements of the body from this position result in relatively small voltage changes (ignoring changes in the magnitude AB which may be caused by body movement.) If the position is such that the value of the cosine function is zero, then relatively large changes in the received voltage will result from small displacements from this position. Since the cosine goes from its maximum value to zero as its argument varies by $\pi/2$ radians, the system varies from minimum to maximum sensitivity as the range varies by an eighth of a wavelength (an eighth instead of a fourth because the reflected wave must travel a total distance of 2R).

This property of variable sensitivity is not always a problem; however, if it proves to be objectionable, then the addition of a second channel in quadrature with the first (a sine channel) and the addition of appropriate signal processing eliminates the positional sensitivity dependence. The sensitivity is eliminated by taking the inverse tangent of the ratio of the channels to obtain an unambiguous phase relationship. The relative magnitude of the reflected signal can be obtained by taking the square root of the sum of the squares of the two channels, if desired.

The relationship between beamwidth of the propagating wave and the aperture diameter d of the radiator can be expressed as:

$$\theta \approx 65 \lambda/d \qquad (24)$$

where $\theta$ is the (half-power) beamwidth in degrees and d is the dimension of the aperture in the plane of interest. Clearly it is desirable to use a beamwidth sufficiently broad that alignment with the target (i.e., the body area of the imaging slice) is not difficult, and simultaneously the beamwidth should be sufficiently narrow to avoid picking up unwanted vibration sources such as the gradient coils, air conditioning ducts, or electric lights; although, these may be filtered out if they have no frequency components near the respiration or heart rate.

For frequencies around the primary resonance frequency, the angle $\theta$ is quite large unless the aperture is made to a size which is impractical in the MR device. Therefore, the use of directional radiators such as horn-type antennas is practically limited to higher frequencies which approach or are within the microwave region.

A preferable horn radiator is a Gunn-diode operated in the gigahertz region. Experiments have shown that at 35 GHz using a six-inch diameter dielectric lens and a 100 mW, Gunn-diode source, heartbeat and respiration waveforms can be acquired at grazing angles of incidence outdoors at ranges of at least 150 feet even though the heartbeat displacements were on the order of a micron. Thus, very low power levels are sufficient for the ranges involved in an MRI system. Inexpensive, Gunnplexer systems are available at frequencies up to roughly 20 GHz. Some include quadrature capability.

Ultrasonic systems may alternatively provide a source of propagating waves. Such a system may also utilize a single transducer provided that the transmit transducer forms one leg of a bridge circuit (balanced under anechoic conditions) and the receiver circuit input is at the balance point of the bridge circuit. Otherwise, they are designed with an amplifier in the received signal leg. Ultrasonic systems tend to be inexpensive to build, can be operated at frequencies which have very small wavelengths (and thus permit narrow interrogating beamwidths and higher sensitivities to a given displacements), and they are attenuated by air (thus making the system less sensitive to objects outside the region of interest). Unfortunately, ultrasound is attenuated by clothing (the attenuation increases with the square of the frequency) and so several thicknesses of a blanket over the region of interest may prove to be a serious impediment of gating signal acquisition.

One of the drawbacks to the foregoing system using a horn radiator involves the presence of 1/f noise in the mixer and, in the case of systems operating at frequencies where it is inconvenient to amplify the received signal, the difficulty of reducing the 1/f noise created by low-frequency amplification. This type of noise is especially bothersome since respiration occurs at frequencies less than one hertz. A general approach to reducing this type of noise is to utilize wide-band systems so that the information in the signal is at a higher frequency that the carrier frequency. One approach is to use frequency modulation (FM) techniques. A quadrature channel may easily be added if needed for resolving phase ambiguities.

From the foregoing, it will be appreciated that a method is disclosed for sensing body motion in an MRI system which is non-invasive with respect to the imaging area. Unlike prior approaches, a sensor need not be placed near or on the body of the subject in order to collect data indicative of the subject's physiological motion. Furthermore, in the preferred embodiment, no additional apparatus is required within the screen room since the RF coil itself serves as the sensor for collecting the physiological data in accordance with the inventive method. By having no need for a sensor to invade the imaging area in order to obtain data indicative of physiological motion, the risk of affecting the MR image from the presence of a sensor is effectively eliminated by the invention. The elimination of a probe within the magnet bore is of considerable importance since the presence of a probe necessarily causes some disruption of the magnetic field of the magnet and, as is well known in MR imaging, the quality of an image provided by a system is greatly affected by the degree of uniformity in the system's magnetic field.

We claim:

1. A method of acquiring data related to motion of a subject within a coil of an MRI device for use in the acquisition of MR data for imaging a region of said subject, said method comprising the steps of:
   generating from a stationary source within said MRI device a signal of a predetermined frequency $\omega$ which interacts with said subject;
   sensing any portion of said generated signal of frequency $\omega$ which is returned to said source;
   comparing the characteristics of the generated signal and the reflected signal to produce a primary waveform, comprised of phase and magnitude differences between the generated and returned signals such that the extent, direction and speed of the motion is reflected in the characteristics of said primary waveform;
   processing said primary waveform so as to provide a derivative waveform indicative of the physiological motion of said subject wherein the extent of said motion is reflected in the amplitude of said derivative waveform and the direction and speed of the motion is reflected in the slope of said derivative waveform, said processing including the step of removing any sensitivity of said derivative waveform characteristics to the position of said subject relative to said stationary source; and
   delivering said derivative waveform to a diagnostic instrument associated with said MRI device for use in synchronizing acquisition of MR data with the motion of said subject.

2. A method as set forth in claim 1 wherein the derivative waveform triggers an MRI sequence for acquiring imaging data.

3. A method as set forth in claim 1 wherein the step of generating a signal of a predetermined frequency $\omega$ includes providing an electromagnetic wave whose source is an RF coil surrounding the imaging region.

4. A method as set forth in claim 3 wherein said RF coil also generates the signals used to acquire MR data from the imaging region.

5. A method as set forth in claim 3 wherein the step of sensing any portion of said generated signal includes the detecting of an interaction between said RF coil and said subject such that motion by said subject changes a quality factor of said RF coil which in turn changes the phase and magnitude of the returned signal.

6. A method as set forth in claim 1 wherein the step of generating a signal of predetermined frequency ω includes providing an electromagnetic wave whose source is a transducer assembly positioned within a bore of a main MR magnet but at a radius of the bore which is approximately equal to or greater than the radius of an RF imaging coil associated with said MRI device.

7. A method as set forth in claim 1 wherein the step of comparing includes mixing said generated and reflected signals.

8. A method as set forth in claim 7 wherein the step of removing positional sensitivity includes generating a complementary waveform from said primary waveform and mixing together said primary and complementary waveforms.

9. A method as set forth in claim 1 wherein the step of removing positional sensivity includes generating a complementary waveform from said primary waveform and combining said primary and complementary waveforms.

10. A method as set forth in claim 9 wherein the step of combining said primary and complementary waveforms includes the step of taking the inverse tangent of the ratio of said complementary and primary waveforms.

11. In an MRI system having a main magnet with a central bore and a RF coil for generating RF signals which excite nuclei in an image region of a subject positioned in the bore of said main magnet so as to generate MR data for acquisition by said system, a method of providing data indicative of the physiological motion of the subject, said method comprising the steps of:
exciting said RF coil with an RF source at a first frequency different from a second frequency used to acquire MR data;
sensing a portion of said first frequency which is reflected by said coil back to said RF source;
comparing the characteristics of the reflected signals with those of the generated signals to produce a trigger signal indicative of relative changes in the characteristics of the generated and reflected signals such that the magnitude of said trigger signal is approximately linearly related to the extent of physiological motion in the imaging region and the slope of said trigger signal is approximately linearly related to the direction and speed of the physiological motion in the imaging region; and
triggering acquisition of MR data in response to said trigger signal so as to generate an MR image which is not blurred by the physiological motion of said imaging region.

12. A method as set forth in claim 11 wherein the relative phases and magnitudes of the generated and reflected signals are compared.

13. A method as set forth in claim 11 wherein the relative phase of the generated and reflected signals are compared.

14. A method as set forth in claim 11 wherein the relative magnitudes of the generated and reflected signals are compared.

15. A method as set forth in claim 11 wherein said RF coil is continuously excited at said first frequency during acquisition of MR data.

16. A method as set forth in claim 15 wherein said signals of first frequency are outside an imaging bandwidth of the MRI system but within a resonance of said RF coil.

17. A method as set forth in claim 11 wherein the step of comparing said generated and reflected signals includes operating a mixer in the square-law region.

18. A method as set forth in claim 11 wherein said different frequency is near the radio frequency used to acquire MR data, but outside the bandwidth of the MRI system.

19. A method as set forth in claim 11 wherein the radio frequency for acquiring MR data is within a primary resonance of said RF coil and said different frequency is within a secondary resonance of said RF coil.

20. In a MRI system, an apparatus for acquiring data related to the physiological motion of an imaging region of a subject, said apparatus comprising:
means (1) for generating a signal by exciting an RF coil of said system at a frequency $\omega_1$ different from a frequency $\omega_2$ used by said MRI system to excite said RF coil for acquisition of MR imaging data;
means (2) for sensing a portion of said signal at the frequency $\omega_1$ reflected by said RF coil as a result of the interaction of the generated signal with the RF coil and the subject;
means (3) for comparing the generated and reflected signals at the frequency $\omega_1$ to provide a trigger signal at the frequency $\omega_1$ whose characteristics are linearly related to the physiological motion of the imaging slice; and
means (4) for receiving the trigger signal and in response thereto signal the acquisition of MR data so that the image of the slice is not blurred by the physiological movement of the slice.

21. An apparatus as set forth in claim 20 wherein said means (3) includes means for providing a trigger signal indicative of the phase relationship between the generated and reflected signals of frequency $\omega_1$.

22. An apparatus as set forth in claim 20 wherein said means (3) includes means for providing a trigger signal indicative of the phase and magnitude relationships between the generated and reflected signals of frequency $\omega_1$.

23. An apparatus as set forth in claim 20 wherein said means (3) includes means for providing a trigger signal whose magnitude is linearly related to the extent of physiological motion and whose slope is linearly related to the frequency and direction of physiological motion.

* * * * *